US012684962B2

(12) United States Patent
Ko et al.

(10) Patent No.: US 12,684,962 B2
(45) Date of Patent: Jul. 14, 2026

(54) DISPLAY PANEL, DISPLAY DEVICE, AND METHOD FOR MANUFACTURING DISPLAY DEVICE

(71) Applicant: LG DISPLAY CO., LTD., Seoul (KR)

(72) Inventors: Younghyun Ko, Paju-si (KR);
ChanYong Jeong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 384 days.

(21) Appl. No.: 18/481,745

(22) Filed: Oct. 5, 2023

(65) Prior Publication Data

US 2024/0215341 A1 Jun. 27, 2024

(30) Foreign Application Priority Data

Dec. 26, 2022 (KR) ........................ 10-2022-0184132

(51) Int. Cl.
 *H10K 59/124* (2023.01)
 *H10K 59/12* (2023.01)
(52) U.S. Cl.
 CPC ....... *H10K 59/124* (2023.02); *H10K 59/1201* (2023.02)
(58) Field of Classification Search
 CPC ............. H10K 59/124; H10K 59/1201; H10K 59/1213
 See application file for complete search history.

(56) References Cited

U.S. PATENT DOCUMENTS

| | | | |
|---|---|---|---|
| 2017/0330938 A1 | 11/2017 | Baeck et al. | |
| 2021/0202639 A1* | 7/2021 | Tsubuku | ............ H10D 30/6739 |
| 2024/0099063 A1* | 3/2024 | Lee | .................... H10K 59/1213 |

FOREIGN PATENT DOCUMENTS

KR 10-2016-0073923 A 6/2016

* cited by examiner

*Primary Examiner* — Matthew L Reames
(74) *Attorney, Agent, or Firm* — Birch, Stewart, Kolasch & Birch, LLP

(57) ABSTRACT

Discussed are a display panel, a display device, and a method for manufacturing the display device, capable of preventing damage to an active layer and deterioration of an element. The display device can include an active layer having a channel area disposed between a first area and a second area, a first barrier layer disposed on a portion of an upper surface of the active layer, a first auxiliary electrode disposed on the first area on the first barrier, a second auxiliary electrode disposed on the second area on the first barrier layer, a first diffusion control layer disposed on the first and second auxiliary electrodes, an insulation layer disposed on the first diffusion control layer, and a first electrode electrically connected to the first auxiliary electrode and a second electrode electrically connected to the second auxiliary electrode, disposed on the insulation layer.

20 Claims, 19 Drawing Sheets

601

500

DISPLAY PANEL, DISPLAY DEVICE, AND METHOD FOR MANUFACTURING DISPLAY DEVICE

CROSS-REFERENCE TO RELATED APPLICATION

This application claims priority to Korean Patent Application No. 10-2022-0184132, filed in the Republic of Korea on Dec. 26, 2022, the entire contents of which is hereby expressly incorporated by reference into the present application.

BACKGROUND

Field

Embodiments of the disclosure relate to a display panel, a display device, and a method for manufacturing the display device.

Discussion of Related Art

Transistors are widely used as switching devices or driving devices in the field of electronic devices.

In particular, transistors are widely used as driving or switching devices in display devices such as liquid crystal display devices or organic light emitting display devices because they can be manufactured on glass or plastic substrates.

Such a transistor includes an active layer. However, the active layer can be damaged in the process of forming the transistor, or inadequate performance by some insulation layers can cause a short circuit between electrodes included in the transistor.

BRIEF SUMMARY OF THE DISCLOSURE

Embodiments of the disclosure relate to a display panel, a display device, and a method for manufacturing a display device, capable of preventing damage to an active layer in the process of forming a transistor, thereby enhancing the lifespan of the transistor and achieving low power consumption.

Embodiments of the disclosure relate to a display panel, a display device, and a method for manufacturing the display device, capable of using a high-permittivity gate insulation layer while preventing the channel area of an active layer conductive due to hydrogen included in an insulation layer.

Embodiments of the disclosure relate to a display panel, a display device, and a method for manufacturing the display device, capable of simplifying components by using components, disposed on the same layer as a plurality of auxiliary electrodes and containing the same material, as, e.g., lines, by using an insulation layer having a high step coverage characteristic.

Embodiments of the disclosure relate to a display panel, a display device, and a method for manufacturing the display device in which an electrode and an active layer formed of an oxide semiconductor material can easily be rendered conductive.

Embodiments of the disclosure can provide a display panel, a display device, and a display device manufacturing method which comprise an active layer disposed on a substrate and including a first area, a second area, and a channel area disposed between the first area and the second area, a first barrier layer disposed on a portion of an upper surface of the active layer, a first auxiliary electrode disposed on the first area on the first barrier, a second auxiliary electrode disposed on the second area on the first barrier layer, a first diffusion control layer disposed on the first auxiliary electrode and the second auxiliary electrode, an insulation layer disposed on the first diffusion control layer, and a first electrode electrically connected to the first auxiliary electrode and a second electrode electrically connected to the second auxiliary electrode, disposed on the insulation layer.

Embodiments of the disclosure can provide a display panel, a display device, and a display device manufacturing method which comprise an active layer disposed on a substrate and including a first area, a second area, and a channel area disposed between the first area and the second area, a first barrier layer disposed on a portion of an upper surface of the active layer, a first auxiliary electrode disposed on the first area on the first barrier, a second auxiliary electrode disposed on the second area on the first barrier layer, a first diffusion control layer disposed on the first auxiliary electrode and the second auxiliary electrode, an insulation layer disposed on the first diffusion control layer, and a first electrode electrically connected to the first auxiliary electrode and a second electrode electrically connected to the second auxiliary electrode, disposed on the insulation layer, wherein the first auxiliary electrode is electrically connected to the first area, and the second auxiliary electrode is electrically connected to the second area.

Embodiments of the disclosure can provide a method for manufacturing a display device, comprising forming an active layer on a substrate, the active layer including a first area, a second area, and a channel area disposed between the first area and the second area, forming a first barrier layer on the active layer, forming a first auxiliary electrode disposed on the first area on the first barrier layer and a second auxiliary electrode disposed on the second area on the first barrier layer, forming a first diffusion control layer disposed on the first auxiliary electrode and the second auxiliary electrode, forming a gate insulation layer disposed on the first diffusion control layer, and forming a first electrode and a second electrode disposed on the gate insulation layer, the first electrode electrically connected with the first auxiliary electrode and the second electrode electrically connected with the second auxiliary electrode.

According to embodiments of the disclosure, there can be provided a display panel, a display device, and a method for manufacturing a display device, capable of preventing damage to the active layer in the process of forming the transistor by including the insulation layer, diffusion control layer, and barrier layer disposed on the active layer, thereby enhancing the lifespan of the transistor and achieving low power consumption.

According to embodiments of the disclosure, there can be provided a display panel, a display device, and a method for manufacturing the display device, capable of using a high-permittivity gate insulation layer while preventing the channel area of an active layer conductive due to hydrogen included in the insulation layer by including the diffusion control layer.

According to embodiments of the disclosure, there can be provided a display panel, a display device, and a method for manufacturing the display device, capable of simplifying components by using components, disposed on the same layer as a plurality of auxiliary electrodes and containing the same material, as, e.g., lines, by using an insulation layer having a high step coverage characteristic.

According to embodiments of the disclosure, there can be provided display panel, a display device, and a method for manufacturing the display device in which an electrode and an active layer formed of an oxide semiconductor material can easily be rendered conductive.

BRIEF DESCRIPTION OF THE DRAWINGS

The above and other objects, features, and advantages of the disclosure will be more clearly understood from the following detailed description, taken in conjunction with the accompanying drawings, in which.

DETAILED DESCRIPTION OF THE EMBODIMENTS

Figure 1:
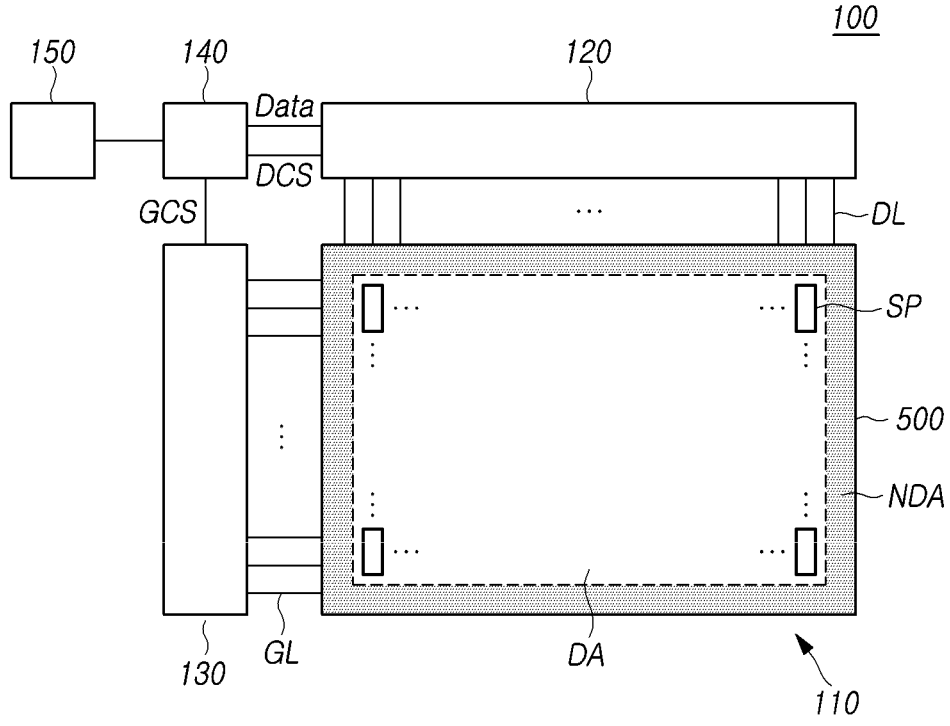
FIG. 1 is a view illustrating a system configuration of a display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description can make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but one or more third elements can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

Hereinafter, various embodiments of the disclosure are described in detail with reference to the accompanying drawings. All components of each display device and each display panel according to all embodiments of the disclosure are operatively coupled and configured.

FIG. 1 is a view illustrating a system configuration of a display device 100 according to embodiments of the disclosure;

Referring to FIG. 1, the display device 100 according to embodiments of the disclosure can include a display panel 110 and driving circuits for driving the display panel 110.

The driving circuits can include a data driving circuit 120 and a gate driving circuit 130. The display device 100 can further include a controller 140 for controlling the data driving circuit 120 and the gate driving circuit 130, and an image processor 150.

The display panel 110 can include a substrate 500 and signal lines, such as a plurality of data lines DL and a plurality of gate lines GL disposed on the substrate 500. The display panel 110 can include a plurality of subpixels SP connected to the plurality of data lines DL and the plurality of gate lines GL.

The display panel 110 can include a display area DA in which images are displayed and a non-display area NDA which is positioned outside of the display area DA and where no image is displayed. In the display panel 110, a plurality of subpixels SP for displaying images can be disposed in the display area DA, and the driving circuits 120, 130, and 140 can be electrically connected or disposed in the non-display area NDA. Further, pad units for connection of integrated circuits or a printed circuit can be disposed in the non-display area NA.

The data driving circuit 120 is a circuit for driving the plurality of data lines DL, and can supply data signals to the plurality of data lines DL. The gate driving circuit 130 is a circuit for driving the plurality of gate lines GL, and can supply gate signals to the plurality of gate lines GL. The controller 140 can supply a data control signal DCS to the data driving circuit 120 to control the operation timing of the data driving circuit 120. The controller 140 can supply a gate control signal GCS for controlling the operation timing of the gate driving circuit 130 to the gate driving circuit 130.

The controller 140 can control to start scanning according to a timing implemented in each frame, convert input image data input from the outside (e.g., from the image processor 150) into image data Data suited for the data signal format used in the data driving circuit 120, supply the image data Data to the data driving circuit 120, and control data driving to proceed at an appropriate time according to the scanning timing.

To control the gate driving circuit 130, the controller 140 can output various gate control signals GCS including a gate start pulse GSP, a gate shift clock GSC, and a gate output enable signal (Gate Output Enable, GOE).

To control the data driving circuit 120, the controller 140 can output various data control signals DCS including, e.g., a source start pulse SSP, a source sampling clock SSC, and a source output enable signal SOE.

The controller 140 can be implemented as a separate component from the data driving circuit 120, or the controller 140, along with the data driving circuit 120, can be implemented as an integrated circuit.

The data driving circuit 120 receives the image data Data from the controller 140 and supply data voltages to the plurality of data lines DL, thereby driving the plurality of data lines DL. The data driving circuit 120 is also referred to as a 'source driving circuit.'

The data driving circuit 120 can include one or more source driver integrated circuit (SDICs).

For example, each source driver integrated circuit (SDIC) can be connected with the display panel 110 by a tape automated bonding (TAB) method or connected to a bonding pad of the display panel 110 by a chip on glass (COG) or chip on panel (COP) method or can be implemented by a chip on film (COF) method and connected with the display panel 110.

The gate driving circuit 130 can output a gate signal of a turn-on level voltage or a gate signal of a turn-off level voltage according to the control of the controller 140. The gate driving circuit 130 can sequentially drive the plurality of gate lines GL by sequentially supplying gate signals of the turn-on level voltage to the plurality of gate lines GL.

The gate driving circuit 130 can be connected with the display panel 110 by TAB method or connected to a bonding pad of the display panel 110 by a COG or COP method or can be connected with the display panel 110 according to a COF method. Alternatively, the gate driving circuit 130 can be formed in a gate in panel (GIP) type, in the non-display area NDA of the display panel 110. The gate driving circuit 130 can be disposed on the substrate 500 or can be connected to the substrate 500. In other words, the gate driving circuit 130 that is of a GIP type can be disposed in the non-display area NDA of the substrate 500. The gate driving circuit 130 that is of a chip-on-glass (COG) type or chip-on-film (COF) type can be connected to the substrate 500.

Meanwhile, at least one of the data driving circuit 120 and the gate driving circuit 130 can be disposed in the display area DA. For example, at least one of the data driving circuit 120 and the gate driving circuit 130 can be disposed not to overlap the subpixels SP or to overlap all or some of the subpixels SP.

When a specific gate line GL is opened by the gate driving circuit 130, the data driving circuit 120 can convert the image data Data received from the controller 140 into an analog data voltage and supply it to the plurality of data lines DL.

The data driving circuit 120 can be connected to one side (e.g., an upper or lower side) of the display panel 110. Depending on the driving scheme or the panel design scheme, data driving circuits 120 can be connected with both the sides (e.g., both the upper and lower sides) of the display panel 110, or two or more of the four sides of the display panel 110.

The gate driving circuit 130 can be connected to one side (e.g., a left or right side) of the display panel 110. Depending on the driving scheme or the panel design scheme, gate driving circuits 130 can be connected with both the sides (e.g., both the left and right sides) of the display panel 110, or two or more of the four sides of the display panel 110.

The controller 140 can be a timing controller used in typical display technology, a control device that can perform other control functions as well as the functions of the timing controller, or a control device other than the timing controller, or can be a circuit in the control device. The controller 140 can be implemented as various circuits or electronic components, such as an integrated circuit (IC), a field programmable gate array (FPGA), an application specific integrated circuit (ASIC), or a processor.

The controller 140 can be mounted on a printed circuit board or a flexible printed circuit and can be electrically connected with the data driving circuit 120 and the gate driving circuit 130 through the printed circuit board or the flexible printed circuit.

The display device 100 according to embodiments of the disclosure can be a display including a backlight unit, such as a liquid crystal display, or can be a self-emission display, such as an organic light emitting diode (OLED) display, a quantum dot display, or a micro light emitting diode (LED) display.

If the display device 100 according to embodiments of the disclosure is an OLED display, each subpixel SP can include an organic light emitting diode (OLED), which by itself emits light, as the light emitting element. If the display device 100 according to embodiments of the disclosure is a quantum dot display, each subpixel SP can include a light emitting element formed of a quantum dot, which is a self-luminous semiconductor crystal. If the display device 100 according to embodiments of the disclosure is a micro LED display, each subpixel SP can include a micro LED, which is self-emissive and formed of an inorganic material, as the light emitting element.

Figure 2:
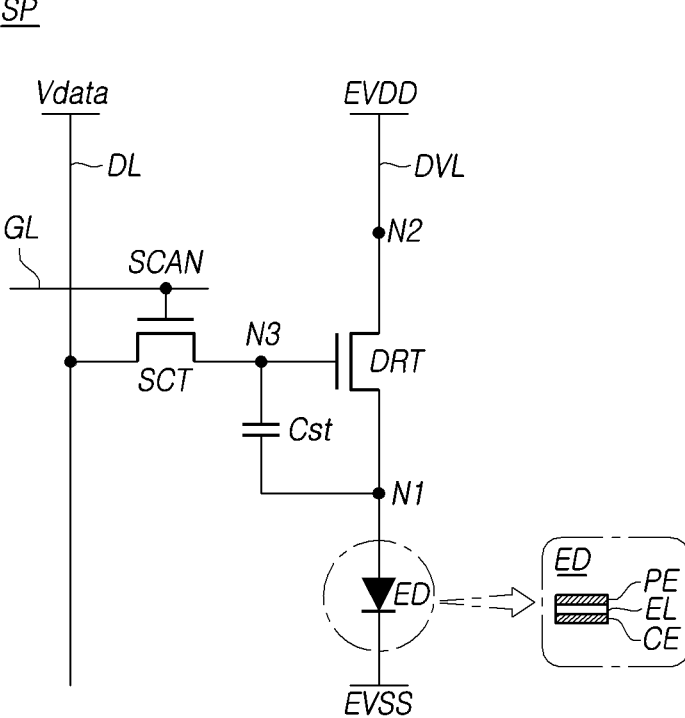
FIG. 2 is an equivalent circuit diagram illustrating a subpixel of a display device according to embodiments of the disclosure.
Figure 3:
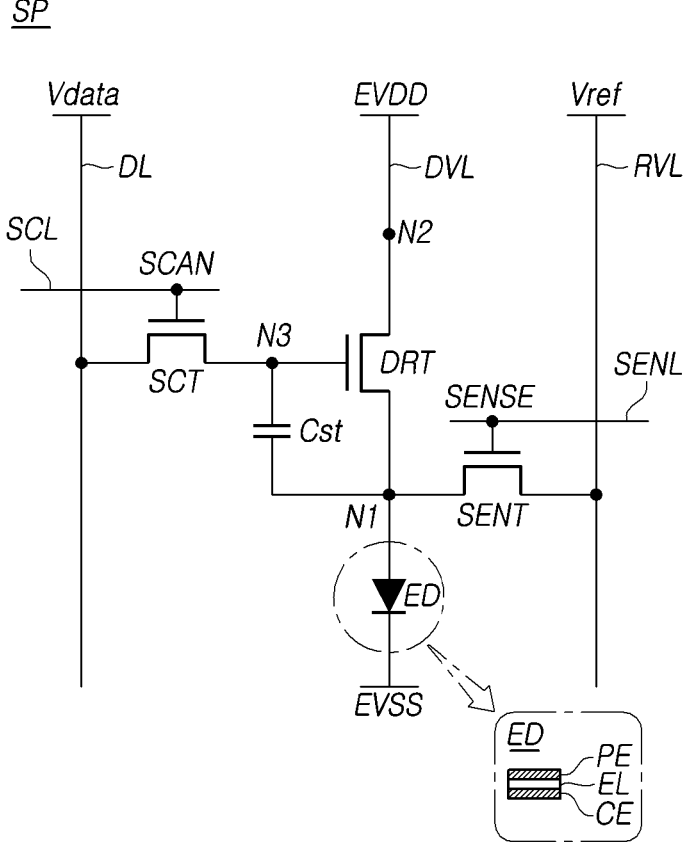
FIG. 3 is another equivalent circuit diagram illustrating a subpixel of a display device according to embodiments of the disclosure.

FIG. 2 illustrates an equivalent circuit of a subpixel SP of a display device 100 according to embodiments of the disclosure, and FIG. 3 illustrates another equivalent circuit of a subpixel SP of the display device 100 according to embodiments of the disclosure.

Referring to FIG. 2, each of a plurality of subpixels SP disposed on a display panel 110 of a display device 100 according to embodiments of the disclosure can include a light emitting element ED, a driving transistor DRT, a scanning transistor SCT, and a storage capacitor Cst.

Referring to FIG. 2, the light emitting element ED can include a pixel electrode PE and a common electrode CE and can include a light emitting layer EL positioned between the pixel electrode PE and the common electrode CE.

The pixel electrode PE of the light emitting element ED can be an electrode disposed in each subpixel SP, and the common electrode CE can be an electrode commonly disposed in all the subpixels SP. Here, the pixel electrode PE can be an anode electrode, and the common electrode CE can be a cathode electrode. Conversely, the pixel electrode PE can be a cathode electrode, and the common electrode CE can be an anode electrode.

For example, the light emitting element ED can be an organic light emitting diode (OLED), a light emitting diode (LED), or a quantum dot light emitting element.

The driving transistor DRT is a transistor for driving the light emitting element ED, and can include a first node N1, a second node N2, and a third node N3.

The first node N1 of the driving transistor DRT can be the source node (source electrode) or the drain node (drain electrode) of the driving transistor DRT, and can be electrically connected to the pixel electrode PE of the light emitting element ED. The second node N2 of the driving transistor DRT can be the drain node (drain electrode) or the source node (source electrode) of the driving transistor DRT and be electrically connected to a driving voltage line DVL supplying the driving voltage EVDD. The third node N3 of the driving transistor DRT can be the gate node (gate electrode) of the driving transistor DRT and be electrically connected to the source node or the drain node of the scanning transistor SCT.

The scanning transistor SCT can be controlled by a scanning gate signal SCAN, which is a type of gate signal, and can be connected between the third node N3 of the driving transistor DRT and the data line DL. In other words, the scanning transistor SCT can be turned on or off according to the scanning gate signal SCAN supplied from the scanning gate line SCL, which is a type of the gate line GL, controlling the connection between the data line DL and the third node N3 of the driving transistor DRT.

The scanning transistor SCT can be turned on by the scanning gate signal SCAN having a turn-on level voltage and transfer the data voltage Vdata supplied from the data line DL to the third node N3 of the driving transistor DRT.

If the scanning transistor SCT is an n-type transistor, the turn-on level voltage of the scanning gate signal SCAN can be a high level voltage. If the scanning transistor SCT is a p-type transistor, the turn-on level voltage of the scanning gate signal SCAN can be a low level voltage.

The storage capacitor Cst can be electrically connected between the third node N3 and first node N1 of the driving transistor DRT. The storage capacitor Cst is charged with the quantity of electric charge corresponding to the voltage difference between both ends thereof and serves to maintain the voltage difference between both ends for a predetermined frame time. Accordingly, during the predetermined frame time, the corresponding subpixel SP can emit light.

Referring to FIG. 3, each of the plurality of subpixels SP disposed on the display panel 110 of the display device 100 according to embodiments of the disclosure can further include a sensing transistor SENT.

The sensing transistor SENT can be controlled by a sensing gate signal SENSE, which is a type of gate signal, and can be connected between the first node N1 of the driving transistor DRT and the reference voltage line RVL. In other words, the sensing transistor SENT can be turned on or off according to the sensing gate signal SENSE supplied from the sensing gate line SENL, which is another type of the gate line GL, controlling the connection between the reference voltage line RVL and the first node N1 of the driving transistor DRT.

The sensing transistor SENT can be turned on by the sensing gate signal SENSE having a turn-on level voltage and transfer a reference voltage Vref supplied from the reference voltage line RVL to the first node N1 of the driving transistor DRT.

The sensing transistor SENT can be turned on by the sensing gate signal SENSE having a turn-on level voltage, transferring the voltage of the first node N1 of the driving transistor DRT to the reference voltage line RVL.

If the sensing transistor SENT is an n-type transistor, the turn-on level voltage of the sensing gate signal SENSE can be a high level voltage. If the sensing transistor SENT is a p-type transistor, the turn-on level voltage of the sensing gate signal SENSE can be a low level voltage.

The function in which the sensing transistor SENT transfers the voltage of the first node N1 of the driving transistor DRT to the reference voltage line RVL can be used upon driving to sense the characteristic value of the subpixel SP. In this case, the voltage transferred to the reference voltage line RVL can be a voltage for calculating the characteristic value of the subpixel SP or a voltage reflecting the characteristic value of the subpixel SP.

Each of the driving transistor DRT, the scanning transistor SCT, and the sensing transistor SENT can be an n-type transistor or a p-type transistor. In the disclosure, for convenience of description, each of the driving transistor DRT, the scanning transistor SCT, and the sensing transistor SENT is an n-type transistor.

The storage capacitor Cst is not a parasitic capacitor (e.g., Cgs or Cgd) which is an internal capacitor existing between the gate node and the source node (or drain node) of the driving transistor DRT, but can be an external capacitor intentionally designed outside the driving transistor DRT.

The scanning gate line SCL and the sensing gate line SENL can be different gate lines GL. In this case, the scanning gate signal SCAN and the sensing gate signal SENSE can be separate gate signals, and the on-off timings of the scanning transistor SCT and the on-off timings of the sensing transistor SENT in one subpixel SP can be independent. In other words, the on-off timings of the scanning transistor SCT and the on-off timings of the sensing transistor SENT in one subpixel SP can be the same or different.

Alternatively, the scanning gate line SCL and the sensing gate line SENL can be the same gate line GL. In other words, the gate node of the scanning transistor SCT and the gate node of the sensing transistor SENT in one subpixel SP can be connected with one gate line GL. In this case, the scanning gate signal SCAN and the sensing gate signal SENSE can be the same gate signals, and the on-off timings of the scanning transistor SCT and the on-off timings of the sensing transistor SENT in one subpixel SP can be the same.

The structures of the subpixel SP shown in FIGS. 2 and 3 are merely examples, and various changes can be made thereto, e.g., such as including one or more transistors or one or more capacitors.

Although the subpixel structure is described in connection with FIGS. 2 and 3 under the assumption that the display device 100 is a self-emission display device, if the display device 100 is a liquid crystal display, each subpixel SP can include a transistor and a pixel electrode.

Figure 4:
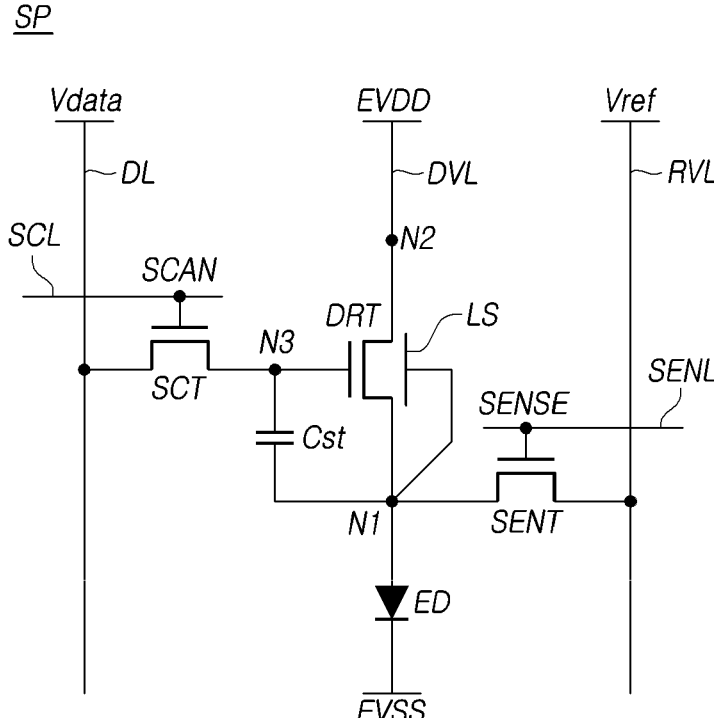
FIG. 4 is a view illustrating a light shield LS in a subpixel of a display device according to embodiments of the disclosure.

FIG. 4 is a view illustrating a light shield LS in a subpixel SP of a display device 100 according to embodiments of the disclosure.

Referring to FIG. 4, in the subpixel SP of the display device 100 according to embodiments of the disclosure, the driving transistor DRT can have intrinsic characteristics, such as threshold voltage and mobility. When the intrinsic characteristics of the driving transistor DRT change, the current driving capability (current supply capability) of the driving transistor DRT changes, and thus the light emitting characteristics of the corresponding subpixel SP can also change.

The device characteristics (e.g., threshold voltage, mobility, etc.) of the driving transistor DRT can change as the driving time of the driving transistor DRT elapses. Further, when light is radiated to the driving transistor DRT, particularly to the channel area of the driving transistor DRT, the device characteristics (e.g., threshold voltage, mobility, etc.) of the driving transistor DRT can change.

Therefore, as illustrated in FIG. 4, to reduce a change in device characteristics (e.g., a change in threshold voltage, change in mobility, etc.) of the driving transistor DRT, a light shield LS can be formed near the driving transistor DRT. For example, the light shield LS can be formed under the channel area of the driving transistor DRT.

Meanwhile, not only does it block light, the light shield LS can also serve as a body of the driving transistor DRT by being formed under the channel area of the driving transistor DRT.

A body effect can occur in the driving transistor DRT. To reduce the body effect, the light shield LS serving as the body of the driving transistor DRT can be electrically connected to the first node N1. Here, the first node N1 of the driving transistor DRT can be the source node of the driving transistor DRT.

Meanwhile, the light shield LS can be disposed not only under the channel area of the driving transistor DRT, but also under the channel area of another transistor (e.g., SCT or SENT).

In the display area DA of the display panel 110 according to embodiments of the disclosure, transistors DRT, SCT, and SENT can be disposed in each subpixel SP. When the gate driving circuit 130 is formed in a gate in panel (GIP) type in the non-display area NDA of the display panel 110 according to embodiments of the disclosure, the plurality of transistors included in the GIP-type gate driving circuit 130 can be disposed in the non-display area NDA of the display panel 110.

As such, a plurality of transistors can be disposed in the display panel 110 according to embodiments of the disclosure. In the process of forming such a transistor, damage to the active layer can deteriorate the element or make the channel area of the active layer conductive to lead to deterioration of the characteristics of the transistor.

Described below in greater detail are a display panel and a display device that can prevent deterioration of the transistor and the channel area of the active layer from being excessively rendered conductive, thereby maintaining the characteristics of the transistor.

Figure 5A:
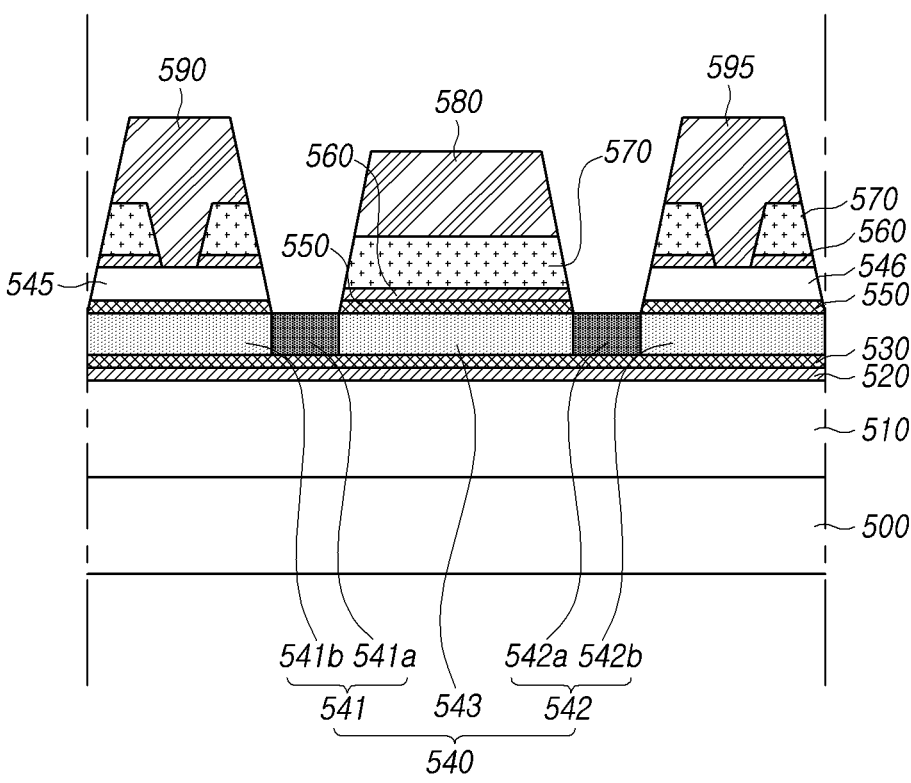
FIGS. 5A and 5B are cross-sectional views illustrating a structure of a transistor according to embodiments of the disclosure.
Figure 5B:
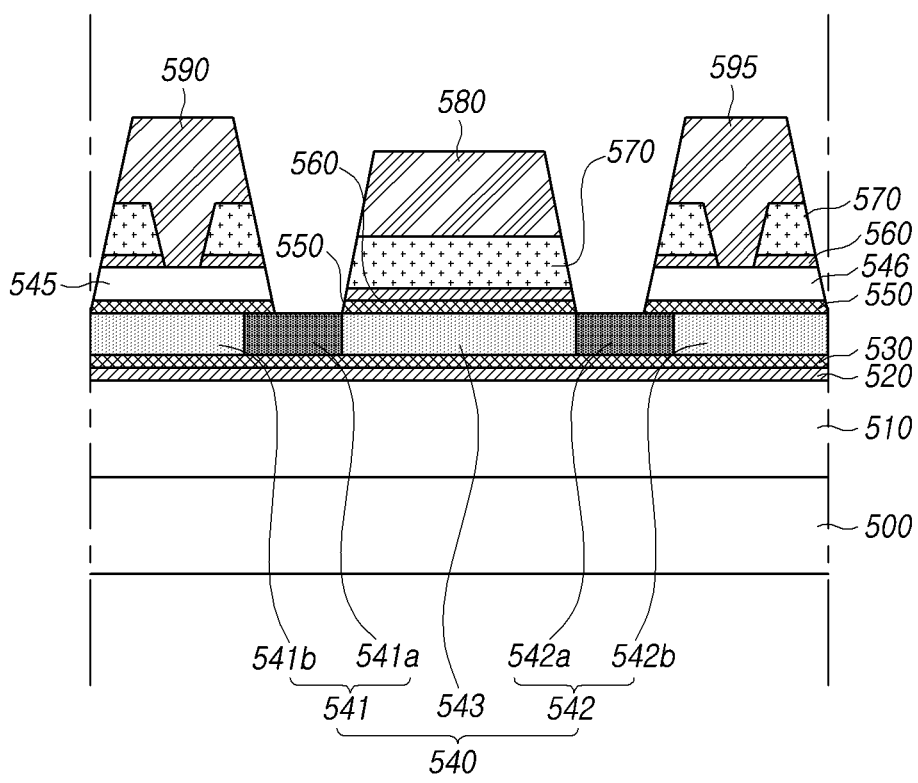

FIGS. 5A and 5B are cross-sectional views illustrating a structure of a transistor according to embodiments of the disclosure. This transistor can be used in any display panel of the disclosure.

Referring to FIGS. 5A and 5B, a transistor according to embodiments of the disclosure can include an active layer 540, a third electrode 580, a first electrode 590, and a second electrode 595.

Specifically, referring to FIGS. 5A and 5B, a buffer layer 510 can be disposed on the substrate 500. FIGS. 5A and 5B illustrate a structure in which the buffer layer 510 is a single layer, but embodiments of the disclosure are not limited thereto, and the buffer layer 510 can be formed in a multilayer structure.

Here, the buffer layer 510 can be an insulation layer containing hydrogen. For example, the buffer layer 510 can be silicon nitride (SiNx).

Referring to FIGS. 5A and 5B, a first diffusion control layer 520 can be disposed on the buffer layer 510.

The first diffusion control layer 520 can be formed of silicon nitride (SiNx) or aluminum oxide (AlxOy). When the first diffusion control layer 520 includes silicon nitride (SiNx), the first diffusion control layer 520 can have a lower hydrogen content than the buffer layer 510.

The first diffusion control layer 520 serves to prevent hydrogen contained in the buffer layer 510 from being diffused to the channel area 543 of the active layer 540 of the transistor to make the channel area 543 conductive.

A first barrier layer 530 can be disposed on the first diffusion control layer 520.

The first barrier layer 530 can be a layer for preventing the threshold voltage (Vth) characteristic of the transistor disposed on the first barrier layer 530 from deteriorating. Further, the first barrier layer 530 can be disposed between the active layer 540 of the transistor and the first diffusion control layer 520 to enhance reliability and electrical characteristics of the transistor.

The first barrier layer 530 can be formed of silicon oxide (SiOx) or aluminum oxide (AlxOy).

Referring to FIGS. 5A and 5B, the active layer 540 of the transistor can be disposed on the first barrier layer 530.

The active layer 540 can include an oxide semiconductor material. The oxide semiconductor material is a semiconductor material produced by controlling conductivity and adjusting the band gap through doping an oxide material, and can generally be a transparent semiconductor material having a wide band gap.

For example, the active layer 540 can include at least one of an indium gallium zinc oxide (IGZO), an indium tin oxide (ITO), a zinc oxide (ZnO), an indium gallium oxide (IGO), an indium zinc oxide (IZO), a cadmium oxide (CdO), an indium oxide (InO), a zinc tin oxide (ZTO), a zinc indium tin oxide (ZITO), and an indium gallium zinc tin oxide (IGZTO), aluminum-doped zinc oxide (AZO), gallium-doped zinc oxide (GZO), antimony tin oxide (ATO), and fluorine-doped transparent oxides (FTO), but embodiments of the disclosure are not limited thereto.

FIGS. 5A and 5B illustrate a structure in which the active layer 540 is a single layer, but embodiments of the disclosure are not limited thereto. For example, the active layer 540 can have a multilayer structure and can include oxide semiconductor layers having different mobilities.

The active layer 540 can include a first area 541, a second area 542, and a channel area 543 disposed between the first area 541 and the second area 542.

The first area 541 and the second area 542 of the active layer 540 can include a conductive area, and the channel area 543 can be a non-conductive area.

Specifically, referring to FIGS. 5A and 5B, the first area 541 and the second area 542 of the active layer 540, respectively, can include some conductive areas 541a and 542a and remaining non-conductive areas 541b and 542b.

A second barrier layer 550 can be disposed on the active layer 540.

The second barrier layer 550 can be formed of silicon oxide (SiOx) or aluminum oxide (AlxOy).

Referring to FIGS. 5A and 5B, the first barrier layer 530 can overlap all of the first area 541, the second area 542, and the channel area 543 of the active layer 540.

The second barrier layer 550 can overlap a portion of the active layer 540.

Specifically, referring to FIGS. 5A and 5B, the second barrier layer 550 can overlaps a portion of the first area 541 of the active layer 540, overlap a portion of the second area 542 of the active layer 540, and the entire channel area 543 of the active layer 540.

In other words, the second barrier layer 550 can be disposed to expose a portion of the upper surface of the first area 541 and a portion of the upper surface of the second area 542 of the active layer 540.

For example, the second barrier layer 550 can be formed through a thin film deposition method capable of controlling thin film deposition, such as a metal-organic chemical vapor deposition (MOCVD) or an atomic layer deposition (ALD).

Here, the metal-organic chemical vapor deposition (MOCVD) method is a type of chemical vapor deposition (CVD) that applies a raw material gas including an organic metal complex to a high-temperature substrate to cause a decomposition reaction on the surface of the substrate to form a thin film on the surface, for example, a technique for growing a semiconductor thin film by pyrolyzing an organic metal gas on a heated substrate. The MOCVD is manipulated at a lower temperature than the CVD using a halide gas, and can perform thin film control in an atomic order and obtain a uniform film.

An atomic layer deposition (ALD) is a deposition method in which particles formed by a chemical reaction between reaction gases are deposited on the substrate surface by separately supplying reaction raw materials. In the ALD, after one reaction raw material is chemically adsorbed on the substrate on which a thin film is deposited, a second or third gas enters and causes chemical adsorption again on the substrate, depositing a thin film.

The MOCVD or ALD can increase thin film productivity or growth rate as compared to general a physical vapor deposition (PVD) and other general chemical vapor deposition (CVD) methods and provide good thin film applicability is good, and is capable of adjusting fine thin film thickness. In other words, use of the MOCVD or ALD enables formation of a thin film having excellent step coverage characteristics.

Further, the MOCVD or ALD enables formation of a thin film with better thickness uniformity and composition uniformity and higher density as compared with other general deposition methods, such as sputtering.

The second barrier layer 550 formed through the MOCVD or ALD method can be a very thin insulation layer.

Further, the second barrier layer 550 formed through the MOCVD or ALD method can have a very small thickness deviation between positions. In other words, the second barrier layer 550 can have good thickness uniformity.

Further, the second barrier layer 550 formed through the MOCVD or ALD method can be a high-density insulation layer.

Meanwhile, the first barrier layer 530 can be formed through a thin film deposition method, such as MOCVD or ALD, for forming the second barrier layer 550.

However, the process of forming the first barrier layer 530 according to embodiments of the disclosure is not limited thereto, and other general CVD or PVD methods than MOCVD or ALD thin film deposition methods can be adopted.

The first barrier layer 530 and the second barrier layer 550 can be formed of the same material, but embodiments of the disclosure are not limited thereto.

The first barrier layer 530 and the second barrier layer 550 can be formed of different materials.

Further, the first diffusion control layer 520 can also be formed by a thin film deposition method, such as MOCVD or ALD. However, embodiments of the disclosure are not limited thereto. For example, the first diffusion control layer 520 can be formed through general CVD or PVD.

Referring to FIGS. 5A and 5B, a first auxiliary electrode 545 and a second auxiliary electrode 546 can be disposed on the second barrier layer 550.

The first auxiliary electrode 545 can be disposed on the second barrier layer 550 disposed on the first area 541 of the active layer 540.

The second auxiliary electrode 546 can be disposed on the second barrier layer 550 disposed on the second area 542 of the active layer 540.

The first auxiliary electrode 545 and the second auxiliary electrode 546 can be formed of a pure metal, not a metal oxide, or an alloy of pure metal components (including two or more metal materials). For example, the first auxiliary electrode 545 and the second auxiliary electrode 546 can include any one of metals such as aluminum (Al), gold (Au), silver (Ag), copper (Cu), tungsten (W), molybdenum (Mo), chromium (Cr), tantalum (Ta), titanium (Ti), or the like, or an alloy thereof. Specifically, the first auxiliary electrode 545 and the second auxiliary electrode 546 can include any one of titanium (Ti) or an alloy including titanium (Ti), but embodiments of the disclosure are not limited thereto.

Each of the first auxiliary electrode 545 and the second auxiliary electrode 546 can include a conductive oxide containing oxygen.

For example, the conductive oxide can include at least one of a transparent conductive oxide (TCO), a nitric oxide, an organic material, or the like. For example, the transparent conductive oxide TCO can include one or more of indium zinc oxide (IZO), indium tin oxide (ITO), indium-gallium-zinc oxide (IGZO), zinc oxide (ZnO), aluminum-doped zinc oxide (AZO), gallium-doped zinc oxide (GZO), antimony tin oxide (ATO), and fluorine-doped transparent oxides (FTO). The nitric oxide can include zinc oxynitride (ZnON) or the like.

The first auxiliary electrode 545 and the second auxiliary electrode 546 can serve to electrically connect the first electrode 590 and the second electrode 595 to the active layer 540.

Referring to FIGS. 5A and 5B, the first area 541 of the active layer 540 can include a first conductive area 541a and a first non-conductive area 541b, and the second area 542 of the active layer 540 can include a second conductive area 542a and the second non-conductive area 542b.

Specifically, the first area 541 of the active layer 540 can include a first conductive area 541a disposed on one side of the channel area 543 and a first non-conductive area 541b disposed on one side of the first conductive area 541a. Further, the second area 542 of the active layer 540 can include a second conductive area 542a disposed on another side of the channel area 543 and a second non-conductive area 542b disposed on one side of the second conductive area 542a.

Referring to FIG. 5A, the first auxiliary electrode 545 can overlap one side surface of the first conductive area 541a, and the second auxiliary electrode 546 can overlap a portion of the upper surface and one side surface of the second conductive area 542a.

Referring to FIG. 5B, the first auxiliary electrode 545 can overlap a portion of the upper surface and one side surface of the first conductive area 541a, and the second auxiliary electrode 545 can overlap one side surface of the second conductive area 542a.

Referring to FIGS. 5A and 5B, a second barrier layer 550 can be disposed between the first auxiliary electrode 545 and the first area 541 of the active layer 540, and a second barrier layer 550 can also be disposed between the second auxiliary electrode 546 and the second area 542 of the active layer 540.

However, since the second barrier layer 550 is formed very thin through a thin film deposition method such as MOCVD or ALD, the contact resistance between the first auxiliary electrode 545 and the first conductive area 541a of the first area 541 of the active layer 540 and the contact resistance between the second auxiliary electrode 546 and the second conductive area 542a of the second area 542 of the active layer 540 can be decreased by the metal insulator semiconductor (MIS) contact principle.

Accordingly, the first auxiliary electrode 545 and the second auxiliary electrode 546 can be electrically connected to the first conductive area 541a and the second conductive area 542a, respectively, of the active layer 540.

Further, the second barrier layer 550 can have a thickness of 50 Å or less.

In some cases, the second barrier layer 550 can have a thickness in the range of 10 to 20 Å or a thickness less than or equal to 10 Å. Considering the role of the second barrier layer 550 to be described below, when the thickness of the second barrier layer 550 exceeds the threshold thickness (e.g., 10, 20, or 50 Å) for each specific condition (e.g., oxygen content), the second barrier layer 550 can fail to perform a carrier transfer function between the first and second electrodes 590 and 595 and the active layer 540. In this case, the transistor may not operate normally.

Referring to FIGS. 5A and 5B, the second diffusion control layer 560 can be disposed on the first auxiliary electrode 545 and the second auxiliary electrode 546, and the second diffusion control layer 560 can be disposed on the second barrier layer 550 disposed on the channel area 543 of the active layer 540.

The second diffusion control layer 560 can be formed of the same material as the first diffusion control layer 520.

The second diffusion control layer 560 can be formed of a material different from that of the first diffusion control layer 520.

The second diffusion control layer 560 can be formed of silicon nitride (SiNx) or aluminum oxide (AlxOy).

Further, the second diffusion control layer 560 can also be formed by a thin film deposition method such as MOCVD or ALD, but embodiments of the disclosure are not limited thereto. For example, the second diffusion control layer 560 can be formed through general CVD or PVD.

In summary, each of the first diffusion control layer 520, the first barrier layer 530, the second barrier layer 550, and the second diffusion control layer 560 according to embodiments of the disclosure can be formed by a MOCVD or ALD, and thus can have excellent film quality.

Accordingly, the first diffusion control layer 520, the first barrier layer 530, the second barrier layer 550, and the second diffusion control layer 560 can have a smaller thickness deviation and a higher density than the buffer layer 510 and the gate insulation layer 570.

The gate insulation layer 570 can be disposed on the second diffusion control layer 560.

The gate insulation layer 570 can include an insulation material having a high permittivity. For example, the gate insulation layer 570 can be silicon nitride (SiNx), but is not limited thereto.

When the gate insulation layer 570 includes silicon nitride (SiNx), it can have a higher hydrogen content than that of the second diffusion control layer 560. The second diffusion control layer 560 can be a thin film of low hydrogen, and can prevent hydrogen contained in the gate insulation layer 570 from spreading to the channel area 543 of the active layer 540.

The gate insulation layer 570 can include the same material as the buffer layer 510, but embodiments of the disclosure are not limited thereto.

When the gate insulation layer 570 is not formed of an oxide-based material, hydrogen can diffuse to the channel area 543 of the active layer 540, causing the channel area 543 to be conductive.

However, in the transistor according to embodiments of the disclosure, the second diffusion control layer 560 prevents hydrogen from diffusing to the channel area 543 of the active layer 540 while forming the gate insulation layer 570. Thus, the electrical characteristics of the transistor can be enhanced using the gate insulation layer 570 having a high permittivity even without a change in the characteristics of the channel area 543 of the active layer 540.

The first electrode 590, the second electrode 595, and the third electrode 580 can be disposed on the gate insulation layer 570.

Specifically, referring to FIGS. 5A and 5B, the third electrode 580 can overlap the channel area 543 of the active layer 540. Here, the third electrode 580 can be the gate electrode of the transistor.

The first electrode 590 can overlap a portion of the first area 541 of the active layer 540. Here, the first electrode 590 can be the source electrode or the drain electrode of the transistor.

The second electrode 595 can overlap a portion of the second area 542 of the active layer 540. Here, the second electrode 595 can be the drain electrode or the source electrode of the transistor. For example, when the first electrode 590 is the source electrode, the second electrode 595 can be the drain electrode, and when the first electrode 590 is the drain electrode, the second electrode 595 can be the source electrode.

Referring to FIGS. 5A and 5B, the first electrode 590 can contact the first auxiliary electrode 545 through a contact hole provided in the gate insulation layer 570 and the second diffusion control layer 560 disposed under the first electrode 590.

The second electrode 595 can contact the second auxiliary electrode 546 through a contact hole provided in the gate insulation layer 570 and the second diffusion control layer 560 disposed under the second electrode 595.

Further, as described above, since the first auxiliary electrode 545 is electrically connected to the first conductive area 541a of the first area 541 of the active layer 540, the first electrode 590 can be electrically connected to the first conductive area 541a of the first area 541 of the active layer 540.

Since the second auxiliary electrode 546 is electrically connected to the second conductive area 542a of the second area 542 of the active layer 540, the second electrode 595 can be electrically connected to the second conductive area 542a of the second area 542 of the active layer 540.

Further, referring to FIGS. 5A and 5B, in the transistor according to embodiments of the disclosure, as the second diffusion control layer 560 is disposed between the first auxiliary electrode 545 and the second auxiliary electrode 546 and the first to third electrodes 580, 590, and 595, an insulation material having a high permittivity and high step coverage can be used as the gate insulation layer 570 material (because the second diffusion control layer blocks a material such as hydrogen), thereby enhancing the covering force of the gate insulation layer 570 disposed on the first auxiliary electrode 545 and the second auxiliary electrode 546 and hence preventing a short circuit between the first auxiliary electrode 545 and the second auxiliary electrode 546 and the third electrode 580.

Accordingly, a component is formed that has the same material as the first auxiliary electrode 545 and the second auxiliary electrode 546 and is disposed on the same layer, and is utilized as a line, thereby simplifying the process.

A process of manufacturing a transistor according to embodiments of the disclosure is briefly described as follows. This transistor can be used in any display device of the disclosure.

Particularly, the process of manufacturing the transistor will now be discussed below with reference to FIGS. 6 to 14.

FIGS. 6, 7, 8, 9, 10, 11, 12, 13, and 14 are schematically illustrating process steps of forming a transistor according to embodiments of the disclosure.

Figure 6:
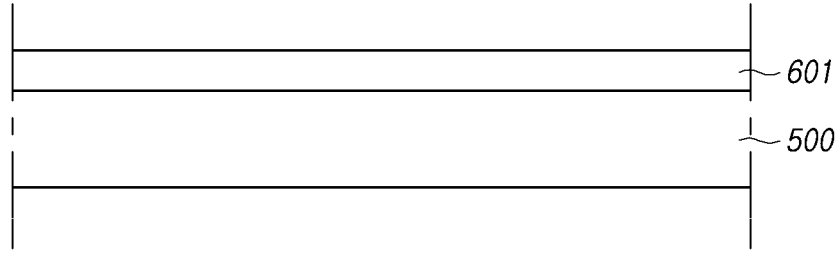
FIGS. 6 to 14 are schematically illustrating process steps of forming a transistor according to embodiments of the disclosure.

Referring to FIG. 6, a light shield 601 can be disposed on the substrate 500.

FIG. 6 illustrates a structure in which the light shield 601 is disposed on the substrate 500, but the transistor according to embodiments of the disclosure can have a structure overlapping the light shield 601 or a structure not overlapping the light shield 601.

Figure 7:
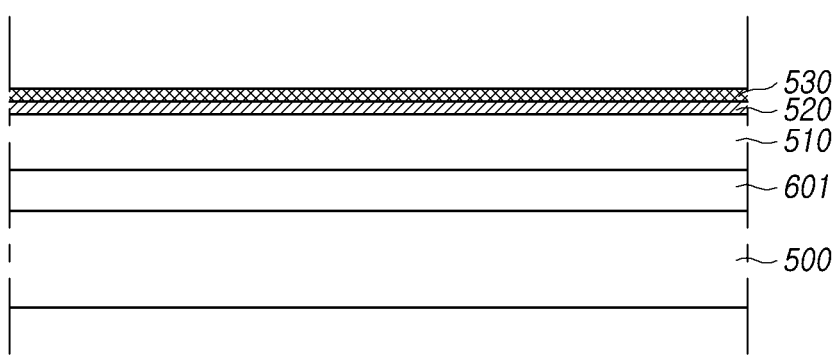

Referring to FIG. 7, a buffer layer 510 can be disposed on the light shield 601.

Referring to FIG. 7, a first diffusion control layer 520 can be disposed on the buffer layer 510, and a first barrier layer 530 can be disposed on the first diffusion control layer 520.

Figure 8:
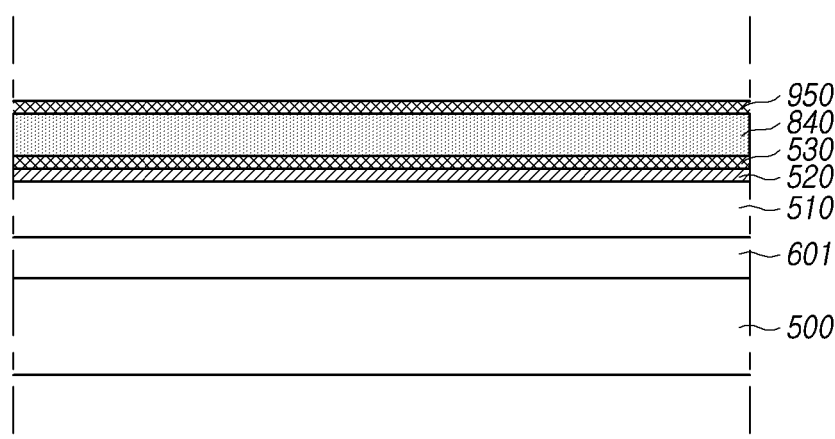

Referring to FIG. 8, an active material layer 840 can be disposed on the first barrier layer 530.

The active material layer 840 can include at least one of an indium gallium zinc oxide (IGZO), an indium tin oxide (ITO), a zinc oxide (ZnO), an indium gallium oxide (IGO), an indium zinc oxide (IZO), a cadmium oxide (CdO), an indium oxide (InO), a zinc tin oxide (ZTO), a zinc indium tin oxide (ZITO), and an indium gallium zinc tin oxide (IGZTO), aluminum-doped zinc oxide (AZO), gallium-doped zinc oxide (GZO), antimony tin oxide (ATO), and fluorine-doped transparent oxides (FTO).

A second barrier material layer 950 can be disposed on the active material layer 840.

The second barrier material layer 950 can include silicon oxide (SiOx) or aluminum oxide (AlxOy).

Figure 9:
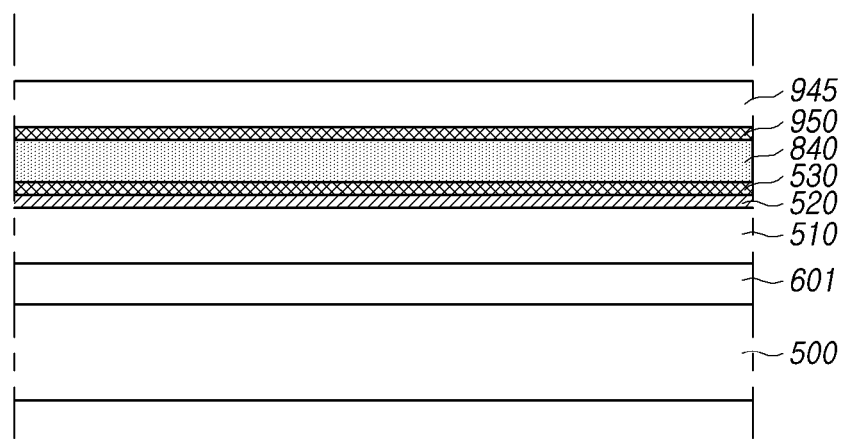

Referring to FIG. 9, an auxiliary electrode material layer 945 can be disposed on the second barrier material layer 950.

The auxiliary electrode material layer 945 can include at least one of a pure metal other, not a metal oxide, or include an alloy of pure metal material components (including two or more metal materials) or can include at least one of a transparent conductive oxide (TCO), a nitric oxide, and an organic material.

Figure 10:
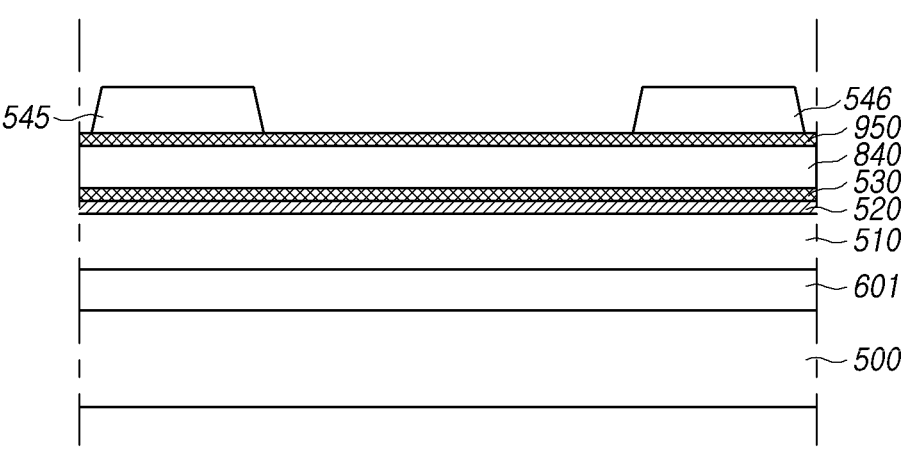

Referring to FIG. 10, an auxiliary electrode material layer 945 can be patterned (e.g., etched) to form the first auxiliary electrode 545 and the second auxiliary electrode 546 spaced apart from each other on the second barrier material layer 950.

Referring to FIG. 10, as a second barrier material layer 950 covering the active material layer 840 is disposed under the auxiliary electrode material layer 945, it is possible to prevent the active material layer 840 from being damaged by a solution or the like used to pattern the auxiliary electrode material layer 945 in the process of patterning the auxiliary electrode material layer 945. In other words, in the process of forming the auxiliary electrode material layer 945, the second barrier material layer 950 can serve to protect the active material layer 840.

Figure 11:
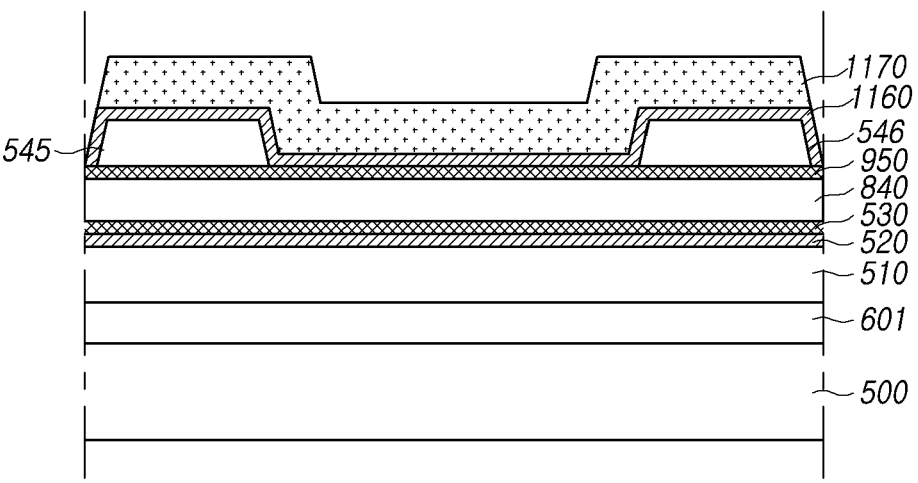

Referring to FIG. 11, a second diffusion control material layer 1160 can be disposed on the substrate 500 on which the first auxiliary electrode 545 and the second auxiliary electrode 546 are formed, and a gate insulation material layer 1170 can be disposed on the second diffusion control material layer 1160.

The second diffusion control material layer 1160 can include silicon nitride (SiNx) or aluminum oxide (AlxOy).

The gate insulation material layer 1170 can be silicon nitride (SiNx), but is not limited thereto.

Figure 12:
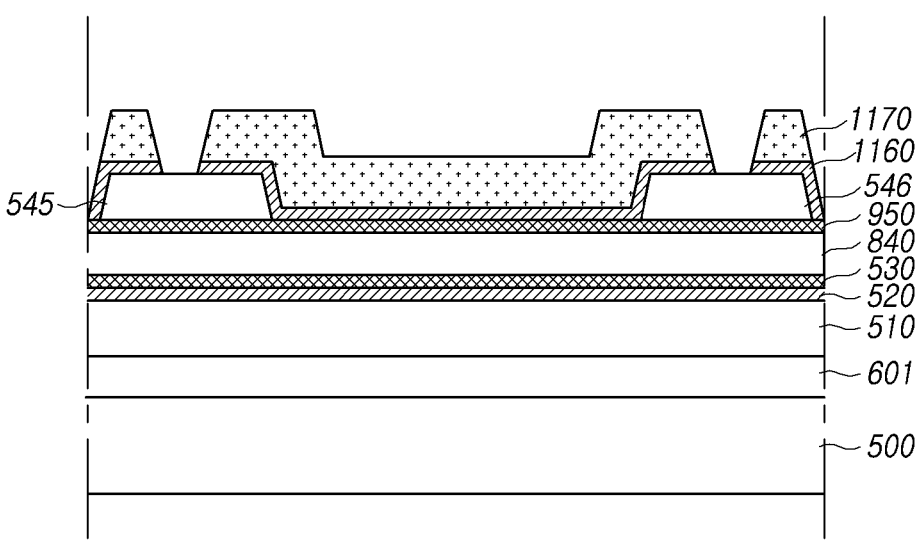

Thereafter, as illustrated in FIG. 12, the gate insulation material layer 1170 and the second diffusion control material layer 1160 can be patterned through a photolithography process using a mask.

Specifically, as illustrated in FIG. 12, contact holes can be formed in the gate insulation material layer 1170 and the second diffusion control material layer 1160.

Each of the contact holes formed in the gate insulation material layer 1170 and the second diffusion control material layer 1160 can be formed at a position capable of exposing a portion of the upper surface of the first auxiliary electrode 545 and exposing a portion of the upper surface of the second auxiliary electrode 546.

Figure 13:
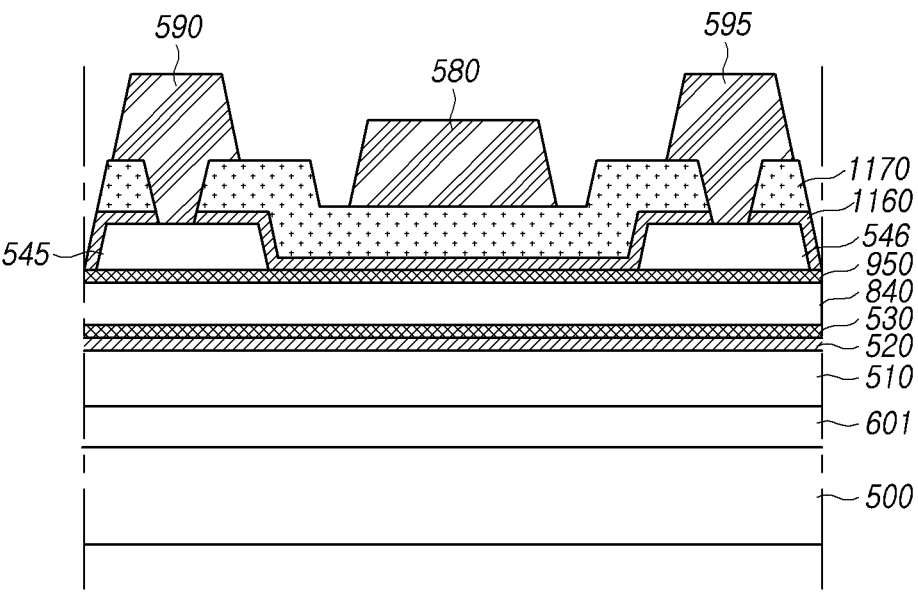

Thereafter, as illustrated in FIG. 13, an electrode material layer can be formed on the substrate 500 and patterned through a photolithography process using a mask to form the third electrode 580, the first electrode 590, and the second electrode 595.

Referring to FIG. 13, the third electrode 580, the first electrode 590, and the second electrode 595 can be disposed to be spaced apart from each other. The first electrode 590 can contact the first auxiliary electrode 545 through the contact hole formed in the gate insulation material layer 1170 and the second diffusion control material layer 1160, and the second electrode 595 can contact the second auxiliary electrode 546 through the contact hole formed in the gate insulation material layer 1170 and the second diffusion control material layer 1160.

Referring to FIG. 13, the gate insulation material layer 1170, the second diffusion control material layer 1160, and the second barrier material layer 950 covering the active material layer 840 are disposed under the third electrode 580, the first electrode 590, and the second electrode 595, thereby preventing the active material layer 840 from being damaged in the process of patterning the third electrode 580, the first electrode 590, and the second electrode 595.

In other words, in the process of forming the third electrode 580, the first electrode 590, and the second electrode 595, the gate insulation material layer 1170, the second diffusion control material layer 1160, and the second barrier material layer 950 can serve to protect the active material layer 840.

Thereafter, the gate insulation material layer 1170, the second diffusion control material layer 1160, and the second barrier material layer 950 can be further patterned using the third electrode 580, the first electrode 590, and the second electrode 595 as masks.

Figure 14:
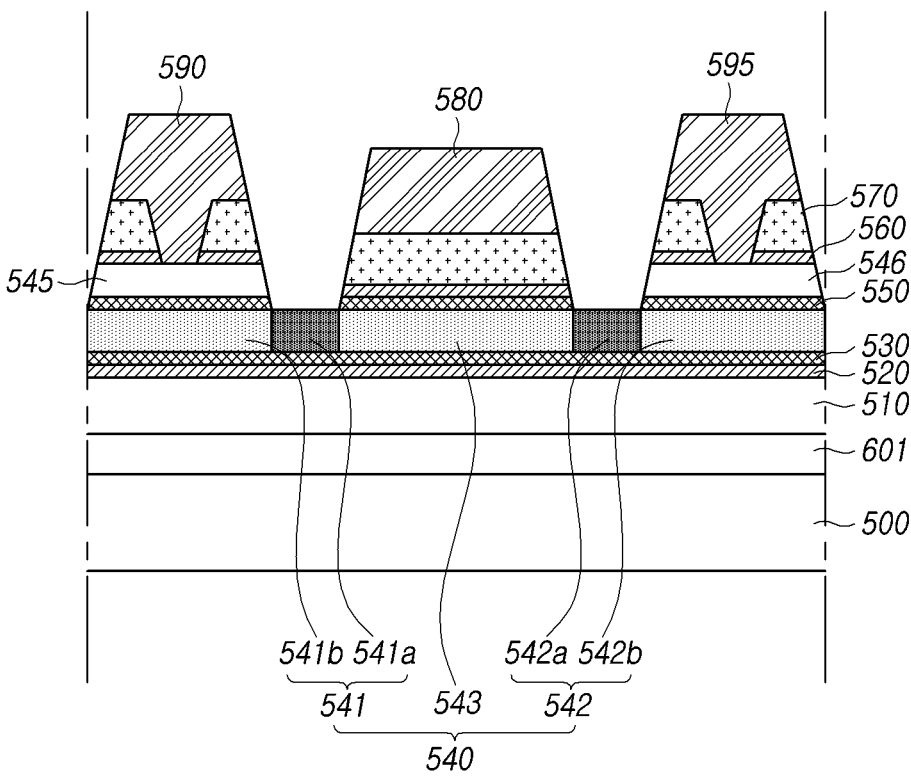

Specifically, the gate insulation material layer 1170, the second diffusion control material layer 1160, and the second barrier material layer 950 disposed in an area that does not overlap the third electrode 580, the first electrode 590, and the second electrode 595 can be etched to form the gate insulation layer 570, the second diffusion control layer 560, and the second barrier layer 550 as illustrated in FIG. 14.

The gate insulation material layer 1170, the second diffusion control material layer 1160, and the second barrier material layer 950 can be patterned through a dry etching process.

Accordingly, as illustrated in FIG. 14, the gate insulation layer 570, the second diffusion control layer 560, and the second barrier layer 550 can be disposed only under the third electrode 580, the first electrode 590, and the second electrode 595, respectively, and the gate insulation layer 570, the second diffusion control layer 560, and the second barrier layer 550 may not be present in an area in which the third electrode 580, the first electrode 590, and the second electrode 595 are absent.

In the process of dry etching the gate insulation material layer 1170, the second diffusion control material layer 1160, and the second barrier material layer 950, a partial area of the active material layer can be rendered conductive.

Specifically, the gate insulation material layer 1170, the second diffusion control material layer 1160, and the second barrier material layer 950 can be etched to form the active material layer in the area overlapping the area where the corresponding material layers have been removed.

Accordingly, as illustrated in FIG. 14, each of the first conductive area 541*a* and the second conductive area 542*a* of the active layer 540 can include an area that does not overlap the gate insulation material layer 1170, the second diffusion control material layer 1160, and the second barrier material layer 950.

Further, the widths of the first conductive area 541*a* and the second conductive area 542*a* of the active layer 540 can vary depending on the condition that the gate insulation material layer 1170, the second diffusion control material layer 1160, and the second barrier material layer 950 are dry-etched.

For example, when the time for dry etching the gate insulation material layer 1170, the second diffusion control material layer 1160, and the second barrier material layer 950 increases, or when the energy of the plasma increases, the widths of the first conductive area 541*a* and the second conductive area 542*a* of the active layer 540 can be increased.

In this case, as illustrated in FIG. 5B, a portion of the upper surface and one side surface of the first conductive area 541*a* of the active layer 540 can overlap the first auxiliary electrode 545, and a portion of the upper surface and one side surface of the second conductive area 542*a* of the active layer 540 can overlap the second auxiliary electrode 546.

Meanwhile, the structure in which the third electrode 580 serving as the gate electrode is disposed on the active layer 540 has been described in connection with FIGS. 5A to 14, but embodiments of the disclosure are not limited thereto.

For example, the third electrode 580 can be disposed under the active layer 540. This is described below with reference to FIG. 15.

Figure 15:
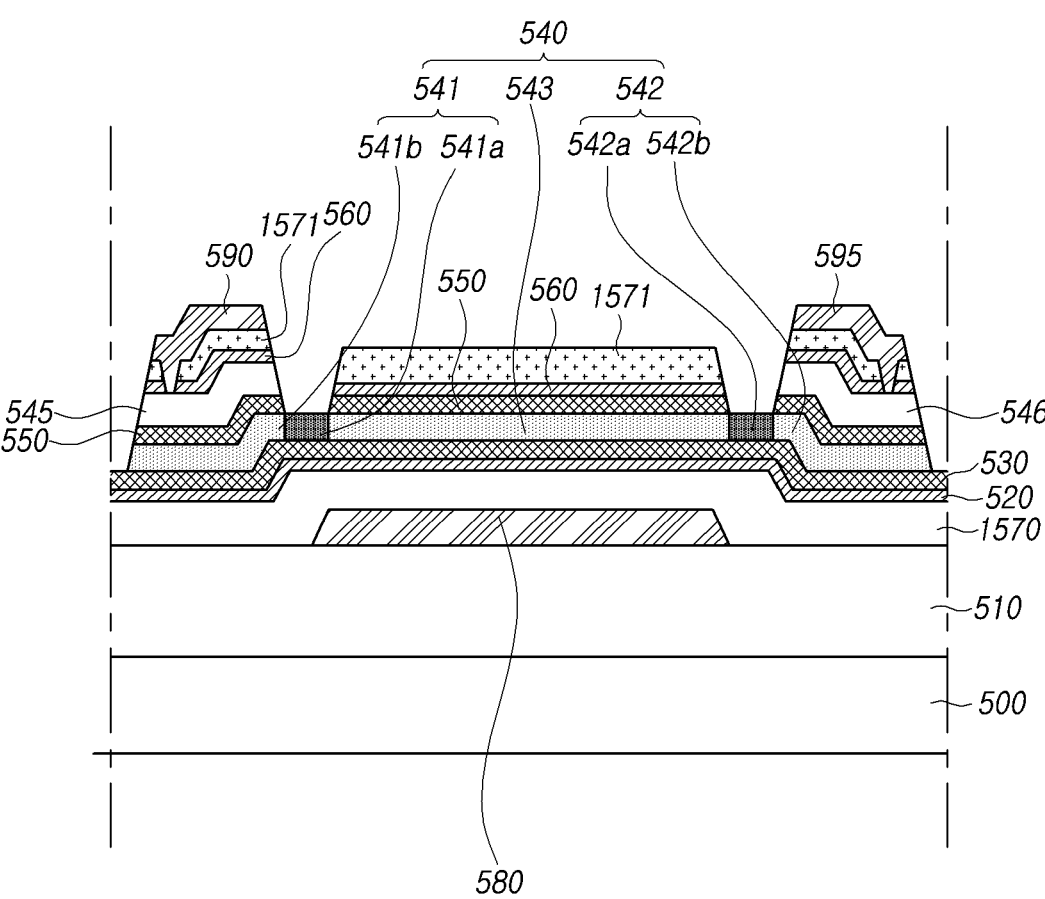
FIG. 15 is a view illustrating a structure in which a third electrode is disposed under an active layer according to an example of the disclosure.

FIG. 15 is a view illustrating a structure in which a third electrode is disposed under an active layer.

Referring to FIG. 15, a buffer layer 510 can be disposed on a substrate 500. A third electrode 580 serving as a gate electrode can be disposed on the buffer layer 510. A gate insulation layer 1570 can be disposed on the third electrode 580.

However, the position of the third electrode 580 according to embodiments of the disclosure is not limited thereto, and the configuration of the buffer layer 510 can be omitted.

The buffer layer 510 and the gate insulation layer 1570 can include the same material. For example, it can be formed of silicon nitride (SiNx) containing hydrogen.

A first diffusion control layer 520 and a first barrier layer 530 can be sequentially disposed on the gate insulation layer 1570.

An active layer 540 overlapping the third electrode 580 and including a channel area 543 can be disposed on the first barrier layer 530.

The first diffusion control layer 520 can serve to prevent, e.g., hydrogen included in the gate insulation layer 1570 from spreading to the channel area 543 of the active layer 540.

A second barrier layer 550 can be disposed on a portion of the upper surface of the active layer 540.

The second barrier layer 550 can be disposed on the channel area 543 of the active layer 540. Further, the second barrier layer 550 can be disposed on a portion of the first area 541 of the active layer 540 and can be disposed on a portion of the second area 542 of the active layer 540.

In an area overlapping the first area 541, a first auxiliary electrode 545 can be disposed on the second barrier layer 550, and in an area overlapping the second area 542, a second auxiliary electrode 545 can be disposed on the second barrier layer 550.

Referring to FIG. 15, the first auxiliary electrode 545 can overlap a portion of the first conductive area 541*a* of the first area 541, and the second auxiliary electrode 546 can overlap a portion of the second conductive area 542*a* of the second area 542.

Further, the first auxiliary electrode 545 can overlap at least a portion of the first non-conductive area 541*b* of the first area 541, and the second auxiliary electrode 546 can overlap at least a portion of the second non-conductive area 542*b* of the second area 542.

Referring to FIG. 15, a second diffusion control layer 560 can be disposed on the first auxiliary electrode 545, the second auxiliary electrode 546, and the second barrier layer 550 disposed on the channel area 543 of the active layer 540.

An insulation layer 1571 can be disposed on the second diffusion control layer 560. The insulation layer 1571 can be silicon nitride (SiNx), but is not limited thereto.

When the insulation layer 1571 includes silicon nitride (SiNx), it can have a higher hydrogen content than that of the second diffusion control layer 560. The second diffusion control layer 560 can be a thin film of low hydrogen, and can prevent hydrogen contained in the insulation layer 1571 from spreading to the channel area 543 of the active layer 540.

Referring to FIG. 15, the first electrode 590 can be disposed on the insulation layer 1571 disposed on the first auxiliary electrode 545, and the second electrode 595 can be disposed on the insulation layer 1571 disposed on the second auxiliary electrode 546.

The second barrier layer 550, the second diffusion control layer 560, and the insulation layer 1571 disposed on the channel area 543 of the active layer 540 can serve to prevent the channel area 543 of the active layer 540 from being damaged in the process of forming the first electrode 590 and the second electrode 595.

Further, as the first barrier layer 530 is disposed under the active layer 540 and the second barrier layer 540 is disposed over the active layer 540, the reliability of the transistor can be enhanced.

As described above, in the transistor according to embodiments of the disclosure, the third electrode 580 serving as a gate electrode can be disposed on the active layer 540 or can be disposed under the active layer 540.

Referring to FIGS. 5A, 5B and 14, in the case where the third electrode 580, the first electrode 590, and the second electrode 595 are disposed on the active layer 540, as the second barrier layer 550, the second diffusion control layer 560, and the gate insulation layer 570 are disposed on the active layer 540, it is possible to prevent damage to the active layer 540 in the process of forming other electrodes disposed on the active layer 540 while preventing the channel area 543 of the active layer 540 from being rendered conductive due to hydrogen generated from the insulation layer disposed on the active layer 540 and enhancing the upper interface characteristics of the active layer 540.

Further, referring to FIGS. 5A, 5B and 14, as the first barrier layer 530 and the first diffusion control layer 520 are disposed under the active layer 540, it is possible to prevent the channel area 543 of the active layer 540 from being rendered conductive due to hydrogen generated from the buffer layer 510 while enhancing the rear interface characteristics of the active layer 540.

Referring to FIG. 15, in the case where the first electrode 590, and the second electrode 595 are disposed on the active layer 540, as the second barrier layer 550, the second diffusion control layer 560, and the insulation layer 1571 are disposed on the active layer 540, it is possible to prevent damage to the active layer 540 in the process of forming other electrodes disposed on the active layer 540 while preventing the channel area 543 of the active layer 540 from being rendered conductive due to hydrogen generated from the insulation layer disposed on the active layer 540 and enhancing the upper interface characteristics of the active layer 540.

Further, referring to FIG. 15, even if the third electrode 580 and the buffer layer 510 are disposed under the active layer 540, the first barrier layer 530 and the first diffusion control layer 520 are disposed under the active layer 540, so that the channel area 543 of the active layer 540 is not rendered conductive and the rear interface characteristics of the active layer 540 can be enhanced.

A pixel electrode (or an anode electrode) can be electrically connected to the first electrode 590 or the second electrode 595 of the transistor illustrated in FIGS. 5A, 5B, 14, and 15.

The electrical characteristics of the transistor according to embodiments of the disclosure are described below.

Figure 16:
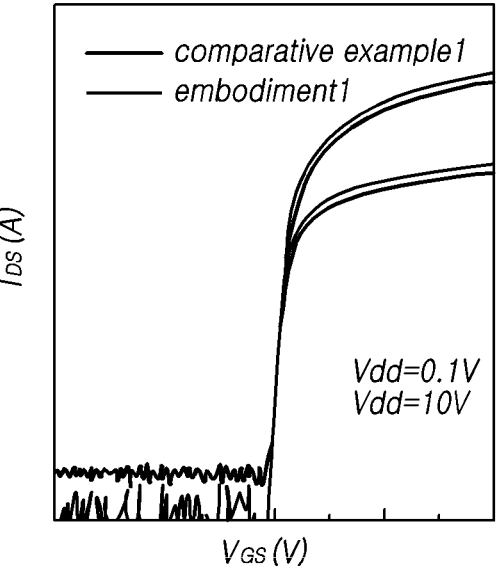
FIG. 16 is a graph illustrating an example of voltage-current characteristics of a transistor according to embodiment 1 of the disclosure and a transistor according to comparative example 1.

FIG. 16 is a graph illustrating an example of voltage-current characteristics of a transistor according to embodiment 1 of the disclosure and a transistor according to comparative example 1. The graph of FIG. 16 illustrates measured values when Vdd is 0.1 V and 10 V, respectively.

In FIG. 16, the transistor according to embodiment 1 can be a transistor having the structure of FIG. 5A or FIG. 5B, and the transistor according to comparative example 1 can have a structure in which a gate insulation layer is disposed on an active layer, a source electrode, a drain electrode, and a gate electrode are disposed on the gate insulation layer, and the gate insulation layer is formed of silicon oxide (SiOx).

In FIG. 16, the thicknesses of the gate insulation layers of embodiment 1 and comparative example 1 each can be 1500 Å.

Referring to FIG. 16, since the gate insulation layer material of the transistor according to embodiment 1 has a higher permittivity than the gate insulation layer material of the transistor according to comparative example 1, current characteristics for the same voltage of the transistor according to embodiment 1 can be superior to those of the transistor according to comparative example 1.

Figure 17:
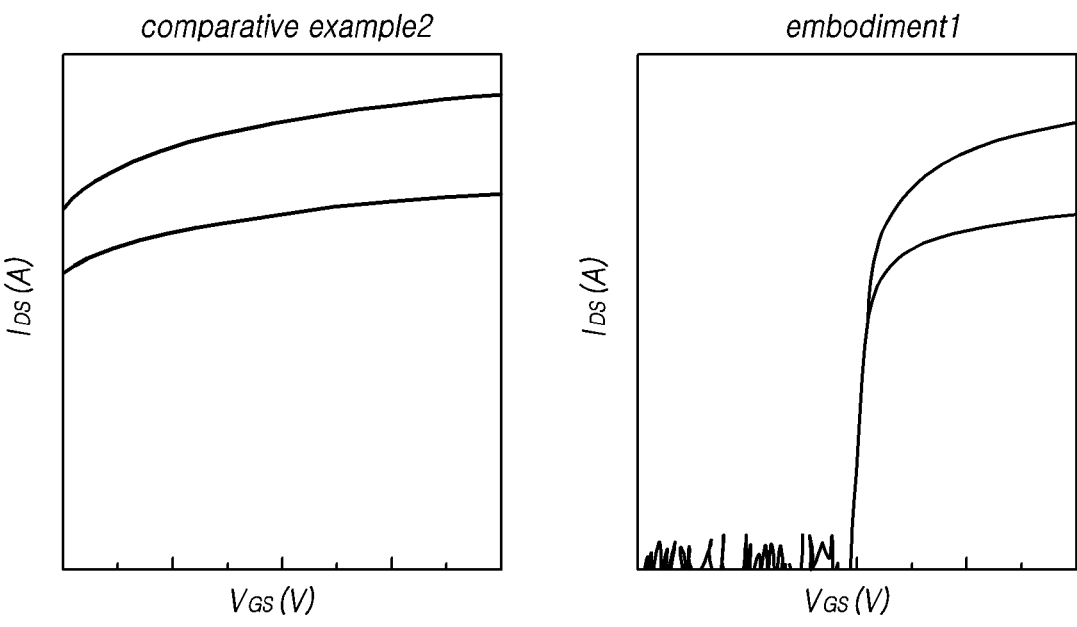
FIG. 17 is a graph illustrating an example of voltage-current characteristics of a transistor according to embodiment 1 of the disclosure and a transistor according to comparative example 2.

FIG. 17 is a graph illustrating an example of voltage-current characteristics of a transistor according to embodiment 1 of the disclosure and a transistor according to comparative example 2.

In FIG. 17, the transistor according to embodiment 1 can be a transistor having the structure of FIG. 5A or FIG. 5B, and the transistor according to comparative example 2 can have a structure in which a gate insulation layer is disposed on an active layer, a source electrode, a drain electrode, and a gate electrode are disposed on the gate insulation layer, and the gate insulation layer is formed of silicon nitride (SiNx).

Referring to FIG. 17, in the transistor according to comparative example 2, it can be identified that the channel area of the active layer is rendered conductive due to hydrogen contained in silicon nitride (SiNx) disposed on the upper surface of the active layer, and thus the characteristics of the transistor are deteriorated.

In contrast, the transistor according to embodiment 1 of the disclosure can prevent the channel area of the active layer from being rendered conductive by the gate insulation layer through the second diffusion control layer disposed between the gate insulation layer and the active layer, and as the interface characteristics of the active layer are enhanced, it can be identified that the electrical characteristics of the transistor are excellent even when the gate insulation layer formed of silicon nitride (SiNx) containing hydrogen is used.

Figure 18:
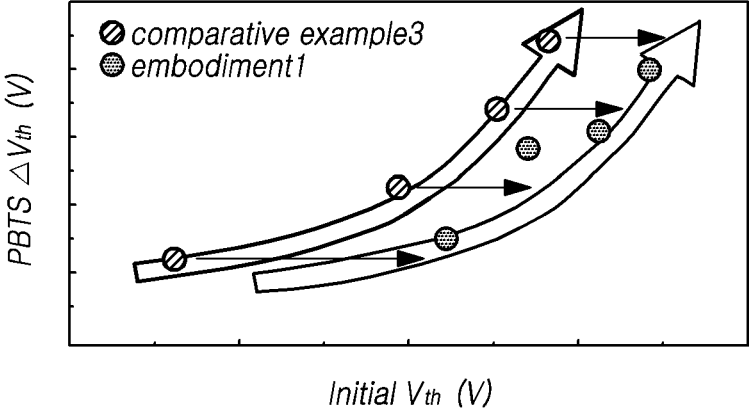
FIG. 18 illustrates an example of positive bias temperature stress (PBTS) values according to initial threshold voltages.

FIG. 18 is a graph illustrating an example of the reliability of a transistor according to embodiment 1 of the disclosure and a transistor according to comparative example 3.

FIG. 18 illustrates positive bias temperature stress (PBTS) values according to initial threshold voltages.

In FIG. 18, the transistor according to embodiment 1 is a transistor having the structure of FIG. 5A. In other words, the second barrier layer disposed on the upper surface of the active layer can be deposited by MOCVD or ALD.

The transistor of comparative example 3 can have a structure in which a gate insulation layer is disposed on the active layer, and a source electrode, a drain electrode, and a gate electrode are disposed on the gate insulation layer. Here, the gate insulation layer of the transistor according to comparative example 1 can be formed through other general CVD (e.g., PECVD) than thin film deposition methods such as MOCVD or ALD.

Referring to FIG. 18, it can be identified that the variation in PBTS value (variation in Vth of the y axis) according to embodiment 1 is small with respect to the same initial threshold voltage.

In other words, it can be identified that the reliability of the transistor according to embodiment 1 is higher than the reliability of the transistor according to comparative example 3.

According to embodiments of the disclosure, there can be provided a display panel and a display device, capable of preventing damage to the active layer in the process of forming the transistor by including the insulation layer, diffusion control layer, and barrier layer disposed on the active layer, thereby enhancing the lifespan of the transistor and achieving low power consumption.

According to embodiments of the disclosure, there can be provided a display panel and a display device, capable of using the high-permittivity gate insulation layer while preventing the channel area of the active layer conductive due to hydrogen included in the insulation layer by including the diffusion control layer.

According to embodiments of the disclosure, there can be provided a display panel and a display device, capable of simplifying components by using components, disposed on the same layer as a plurality of auxiliary electrodes and containing the same material, as, e.g., lines, by using an insulation layer having a high step coverage characteristic.

According to the embodiments of the disclosure, there can be provided a display panel and a display device in which an electrode and an active layer formed of an oxide semiconductor material can easily be rendered conductive.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the disclosure. The above description and the accompanying drawings provide an example of the technical idea of the disclosure for illustrative purposes only. For example, the disclosed embodiments are intended to illustrate the scope of the technical idea of the disclosure.

What is claimed is:

1. A display device, comprising:
an active layer disposed on a substrate and including a first area, a second area, and a channel area disposed between the first area and the second area;
a first barrier layer disposed on a portion of an upper surface of the active layer;
a first auxiliary electrode disposed on the first area on the first barrier layer;
a second auxiliary electrode disposed on the second area on the first barrier layer;
a first diffusion control layer disposed on the first auxiliary electrode and the second auxiliary electrode;
a gate insulation layer disposed on the first diffusion control layer; and
a first electrode and a second electrode disposed on the gate insulation layer, the first electrode being electrically connected with the first auxiliary electrode and the second electrode being electrically connected with the second auxiliary electrode.

2. The display device of claim 1, wherein the first area of the active layer includes a first conductive area disposed on one side of the channel area and a first non-conductive area disposed on one side of the first conductive area, and
wherein the second area of the active layer includes a second conductive area disposed on another side of the channel area and a second non-conductive area disposed on one side of the second conductive area.

3. The display device of claim 2, wherein at least a portion of the first conductive area and the second conductive area does not overlap the first barrier layer, the first diffusion control layer, and the gate insulation layer.

4. The display device of claim 2, wherein the first auxiliary electrode overlaps one side of the first conductive area and the first non-conductive area, and
wherein the second auxiliary electrode overlaps one side of the second conductive area and the second non-conductive area.

5. The display device of claim 2, wherein the first auxiliary electrode overlaps one side of the first conductive area, a portion of an upper surface of the first conductive area, and the first non-conductive area, and wherein the second auxiliary electrode overlaps one side of the second conductive area, a portion of the upper surface of the first conductive area, and the second non-conductive area.

6. The display device of claim 2, wherein the first auxiliary electrode is electrically connected to the first conductive area, and
wherein the second auxiliary electrode is electrically connected to the second conductive area.

7. The display device of claim 1, wherein the first barrier layer is disposed on an upper surface of the channel area,
wherein the first diffusion control layer overlapping the channel area is disposed on the first barrier layer, and
wherein the gate insulation layer overlapping the channel area is disposed on the first diffusion control layer.

8. The display device of claim 7, further comprising:
a third electrode overlapping the channel area and disposed on the gate insulation layer, wherein the third electrode is a gate electrode.

9. The display device of claim 1, further comprising:
a second barrier layer disposed under the active layer;
a second diffusion control layer disposed under the second barrier layer; and
a buffer layer disposed under the second diffusion control layer.

10. The display device of claim 9, further comprising:
a third electrode overlapping the channel area of the active layer and disposed between the substrate and the second diffusion control layer,
wherein the third electrode is a gate electrode.

11. The display device of claim 9, wherein at least one of the first barrier layer and the second barrier layer is formed of silicon oxide $SiO_x$ or aluminum oxide $Al_xO_y$,
wherein at least one of the first diffusion control layer and the second diffusion control layer is formed of silicon nitride $SiN_x$ or aluminum oxide $Al_xO_y$, and
wherein at least one of the buffer layer and the gate insulation layer is formed of silicon nitride $SiN_x$.

12. The display device of claim 11, wherein the buffer layer and the gate insulation layer contain more hydrogen than the first diffusion control layer and the second diffusion control layer, respectively.

13. The display device of claim 1, wherein the first barrier layer has a thickness of about 50 Å or less, and
wherein the first barrier layer has a smaller thickness deviation and a higher density than the gate insulation layer.

14. The display device of claim 1, wherein the first electrode is connected to the first auxiliary electrode through a contact hole provided in the first diffusion control layer and the gate insulation layer, and
wherein the second electrode is connected to the second auxiliary electrode through another contact hole provided in the first diffusion control layer and the gate insulation layer.

15. The display device of claim 1, wherein at least one of the first auxiliary electrode and the second auxiliary electrode are formed of a pure metal, an alloy of pure metal components, or a transparent conductive oxide.

16. A display panel, comprising:
an active layer disposed on a substrate and including a first area, a second area, and a channel area disposed between the first area and the second area;
a first barrier layer disposed on a portion of an upper surface of the active layer;
a first auxiliary electrode disposed on the first area on the first barrier layer;

a second auxiliary electrode disposed on the second area on the first barrier layer;

a first diffusion control layer disposed on the first auxiliary electrode and the second auxiliary electrode;

an insulation layer disposed on the first diffusion control layer; and a first electrode and a second electrode disposed on the insulation layer, the first electrode being electrically connected with the first auxiliary electrode and the second electrode being electrically connected with the second auxiliary electrode, wherein the first auxiliary electrode is electrically connected to the first area of the active layer, and the second auxiliary electrode is electrically connected to the second area of the active layer.

17. A method for manufacturing a display device, the method comprising:

forming an active layer on a substrate, the active layer including a first area, a second area, and a channel area disposed between the first area and the second area;

forming a first barrier layer on the active layer;

forming a first auxiliary electrode disposed on the first area on the first barrier layer, and forming a second auxiliary electrode disposed on the second area on the first barrier layer;

forming a first diffusion control layer disposed on the first auxiliary electrode and the second auxiliary electrode;

forming a gate insulation layer disposed on the first diffusion control layer; and forming a first electrode and a second electrode disposed on the gate insulation layer, the first electrode being electrically connected with the first auxiliary electrode and the second electrode being electrically connected with the second auxiliary electrode.

18. The method of claim 17, further comprising:

before forming the active layer, forming a buffer layer on the substrate;

forming a second diffusion control layer on the buffer layer; and forming a second barrier layer on the second diffusion control layer.

19. The method of claim 17, further comprising, before forming the first electrode and the second electrode, forming a first contact hole and a second contact hole in a material for forming the gate insulation layer and a material for forming the first diffusion control layer, wherein the first electrode contacts the first auxiliary electrode through the first contact hole formed in the material for forming the gate insulation layer and the material for forming the first diffusion control layer, and wherein the second electrode contacts the second auxiliary electrode through the second contact hole formed in the material for forming the gate insulation layer and the material for forming the first diffusion control layer.

20. The method of claim 17, further comprising:

forming a third electrode while forming the first electrode and the second electrode, wherein the third electrode is formed to be disposed on the gate insulation layer and on the channel area of the active layer.

* * * * *